DOUBLE EPITAXIAL METHOD OF FABRICATING A PEDESTAL TRANSISTOR

Filed Nov. 10, 1969 4 Sheets-Sheet 1

INVENTOR
DAVID DE WITT
BY Kenneth R. Stevens
ATTORNEY

United States Patent Office 3,709,746 Patented Jan. 9, 1973

3,709,746

DOUBLE EPITAXIAL METHOD OF FABRICATING A PEDESTAL TRANSISTOR

David De Witt, Poughkeepsie, N.Y., assignor to International Business Machines Corporation, Armonk, N.Y.

Filed Nov. 10, 1969, Ser. No. 875,013
Int. Cl. H01l 7/36, 19/00
U.S. Cl. 148—175 5 Claims

ABSTRACT OF THE DISCLOSURE

A double epitaxial process for forming a pedestal transistor comprising the steps of providing a substrate of a first conductivity type and then forming first and second opposite conductivity type epitaxial layers thereover. During the growth of the epitaxial layers, selected out-diffusions from the epitaxial layers form a buried subcollector and pedestal collector region. Diffused isolation regions and base and emitter regions are formed to complete the device in monolithic form. Precise thickness and concentration control in the top epitaxial layer affords optimization of extrinsic base-collector capacitance.

BACKGROUND OF THE INVENTION

Field of the invention

This invention relates to semiconductor devices and more particularly to a process for forming a monolithic integrated circuit pedestal transistor structure.

Brief description of the prior art

In the formation of pedestal transistors in integrated circuits, it is of the utmost importance to obtain extremely high quality surfaces at the conclusion of each process step. As technology is directed towards smaller and smaller devices in order to reduce costs and provide higher speeds of operation, the uniformity of process control is even more significant. Accordingly, process steps which are tolerable for discrete devices and slower speed integrated circuits are not fully adaptable to process steps wherein device sizes are measured in angstroms. Of course, the ability to accurately control junction depths, epitaxial layer thicknesses, and surface uniformity and quality enable monolithic integrated circuits to be built which have much smaller dimensions than was previously obtainable. The capability of working with small geometry devices increases device density and thus lowers cost, but requires that the devices have the capacity to handle high current densities. Dègradation in device performance due to high current densities is well known. Device dimensions are extremely critical and directly related to the high frequency switching performance of a monolithic integrated circuit transistor device, sometimes characterized by $F_T$ which represents a figure of merit or power gain band-with for exertmely high frequency operation.

It is known that to improve high frequency switching response using conventional transistors, it is required to compromise between reduced collector capacitance and collector resistance. Lighter doping in the collector region decreases capacitance at the expense of increased collector resistance.

The art of monolithic integrated circuits has progressed in the direction of making transistors with smaller dimensions both to increase circuit density and to increase device speed. The increase of circuit density lowers cost because more circuitry is obtained from a processed semiconductor wafer and it also increases speed because delays due to interwiring between circuits is reduced. A prime factor in determining the speed of a transistor is its base width, since transit time for injected carriers to cross the base is proportional to the square of the base width. As the base width is reduced, the impurity density in the base must be increased in order to keep the base resistance at a useful low value. To maintain emitter injection efficiency, the impurity density in the emitter must be correspondingly increased, and to maintain a low value of collector resistance and assist in accurately defining the base-collector junction of a narrow base it has been found necessary to increase the impurity density in the collector. The effect of increasing impurity densities in the regions of a narrow base transistor is to greatly increase the junction capacitance per unit area. Conventional planar transistors require a collector junction area 5 to 10 times greater than the operating collector area of the internal transistor in order to provide surface area for base contacts. It is not functionally necessary that the extrinsic collector junction area have the same capacitance per unit area as the active internal region.

The previous art as described in U.S. Pat. No. 3,312,-881, Yu, and assigned to the assignee of the present application, provides for an extrinsic capacitance per unit area lower than the internal capacitance per unit area by two methods. The first method uses a heavily doped substrate of collector doping type on which an internal layer is grown epitaxially. The active internal collector region 15 is formed by a collector impurity type diffusion from the surface which penetrates to the collector impurity type substrate. The base and emitter regions are then diffused from the surface. The base diffusion is designed so that in the extrinsic area of the device, it does not reach the substrate but is separated from it by an intrinsic material region. This method is limited as to the collector type impurity level which can be achieved at the base-collector junction and in the collector adjacent to that junction. If it is attempted to get high impurity density in the collector by raising the surface concentration of the internal collector diffusion, the base region will contain an even higher collector type impurity density which then must be compensated by the base diffusion. Precise compensation to get a precisely defined base requires impractical process control. In addition, the carrier mobility in heavily compensated semiconductor material is lower than that in lightly compensated material, reducing speed. If it is attempted to get uniform high collector type impurity density in the internal collector diffusion by diffusing for a very long time, the substrate doping will out-diffuse into the internal layer.

The second method of the Yu patent employs a double epitaxial scheme in which intrinsic epitaxy is grown on a substrate of high collector type impurity density. In the internal transistor area, a high impurity density collector type diffusion is performed, reaching the substrate. A second internal epitaxial layer is then applied, burying the collector type diffusion in the internal transistor area. This diffusion then appears like a buried pedestal of collector type material. The base and emitter diffusions are then performed. The base diffusion is designed so that an internal region is left between the termination of the internal transistor area base diffusion and the pedestal. This method is limited in the current density at which it can operate before the effective base width widens through the internal region to the pedestal. This base widening caused by current density has been called the "Kirk" effect and is a consequence of the finite limiting velocity of carriers in semiconductor crystals. At a finite velocity of carriers, the carrier density required is proportional to the current density. The charge polarity of these carriers is the same as the lattice charge polarity of the base impurity type. Hence, the collector junction cannot form until a depth is reached where the collector type impurity density exceeds the mobile carrier charge density.

Accordingly, improved processes for optimizing these numerous design parameters are necessary in order to obtain high frequency performance in the resulting monolithic integrated circuit devices. The latitude and tolerance variations which were permissible with discrete transistor devices, or even with monolithic devices, are no longer endurable.

SUMMARY OF THE INVENTION

It is, therefore, an object of the present invention to fabricate an integrated circuit pedestal transistor by an improved process which results in the formation of transistor devices having smaller dimensions than previously obtainable without sacrificing high frequency switching performance.

It is another object of the present invention to provide a process for manufacturing an integrated circuit pedestal transistor having shallow junctions while eliminating undesirable base-widening and base-collector capacitance problems, and thus increase current handling capacity and improve high frequency performance.

In accordance with the aforementioned objects, the present invention provides a process for precise fabrication of a monolithic integrated circuit including at least one pedestal transistor device using a double epitaxial process which includes the steps of providing a substrate of a first conductivity and then forming first and second opposite conductivity type epitaxial layers thereover. During the growth of the epitaxial layers, a material, such as arsenic, is outdiffused into the epitaxial layers to form a buried subcollector and a pedestal collector region. Diffused isolation regions and base and emitter regions are formed to complete the device in monolithic form.

The foregoing and other objects, features and advantages of the present invention will be apparent from the following more particular description of the embodiments of the invention, as illustrated in the accompanying drawings:

BRIEF DESCRIPTION OF THE PREFERRED EMBODIMENTS

Figure 1:
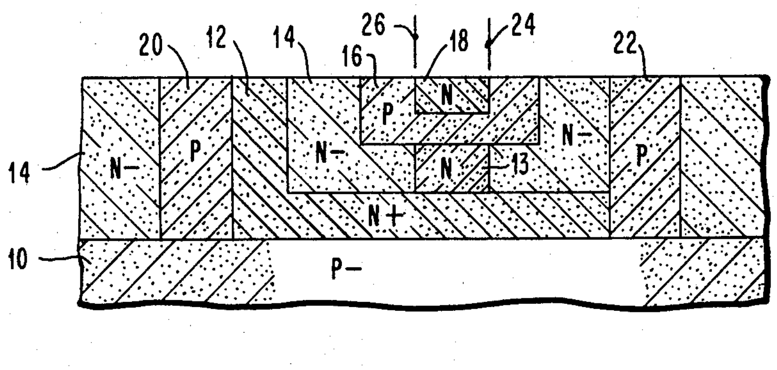
FIG. 1 PRIOR ART
FIG. 1 is a cross-sectional view illustrating a partial section of a monolithic pedestal circuit transistor fabricated according to the principles of a prior art discrete pedestal device.

In FIG. 1, a pedestal transistor fabricated in monolithic form is shown and comprises a starting substrate upon which has been formed a buried subcollector and pedestal transistor device. This structure, in monolithic form, is fabricated by a process which essentially employs the basic principles disclosed in U.S. Pat. 3,312,881, previously mentioned. This prior art patent does not disclose a pedestal transistor structure in monolithic form, but rather as a discrete device, however, one application of its principles to monolithic devices would result in a device and impurity profile similar to that of FIGS. 1 and 2. Such a depiction is made in order to better emphasize the present invention.

This device comprises a $P^-$ type conductivity substrate 10 upon which has been formed a transistor comprising a buried layer subcollector $N^+$ region 12 having an N pedestal portion 13, an $N^-$ type conductivity collector region 14, a P type conductivity base region 16, and an N type emitter diffused region 18. The P type isolation dffused regions 20 and 22 electrically isolate the transistor from other monolithic devices on the substrate during operation. The $N^-$ type collector region 14, presently shown, is likened to the intrinsic material deposited in the extrinsic operational portion of the device shown in the Yu patent. The internal operational portion of the device constitutes the emitter, base and collector regions located between lines 24 and 26 and extending transversely through the device. The regions to the left and right of lines 24 and 26 constitute the extrinsic regions of the transistor. These extrinsic operational regions are not essential to the transistor operation but are required in order to provide electrical contacts to the active base region located in the internal operational portion.

Figure 2:
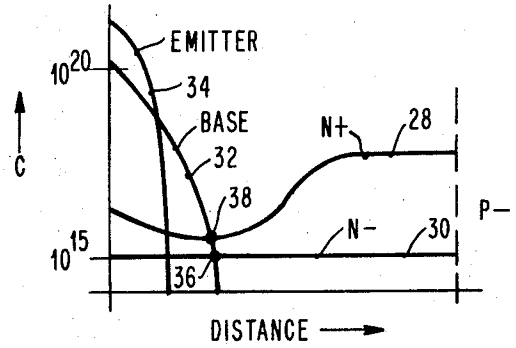
FIG. 2 is a graph illustrating the impurity profile for the structure of FIG. 1.

In FIG. 2, curve 28 represents the composite profile for the $N^+$ layer 12 extending from the $P^-$ substrate towards the surface of the device, and also the N type portion 13. The Yu patent does not specifically disclose how the N portion 13 is formed, but by using any of known techniques, the process would give rise to a composite characteristic as illustrated by curve 28. The $N^-$ collector region 14 is represented by curve 30, and illustrates an epitaxial type profile. Thereafter, conventional base and emitter diffusions, as represented by curves 32 and 34 complete the impurity profile for the device of FIG. 1.

In the internal collector portion of the transistor, it is desirable to have a high concentration of collector impurities so as to reduce the base widening or "Kirk" effect. Concurrently, the existence of a high impurity concentration in the internal collector region allows for a relatively high impurity concentration in the base region and thus reduction in base resistance with further improvement in performance. The impurity profile shown in FIG. 2 illustrates that the impurity concentration level in the internal collector portion 13 is rigidly constrained by the intersection of curves 28 and 32 at depths greater than point 38. It is not readily possible to raise the concentration level, point 38, in this portion, otherwise a conventional base diffussion is not feasible.

Figure 3:
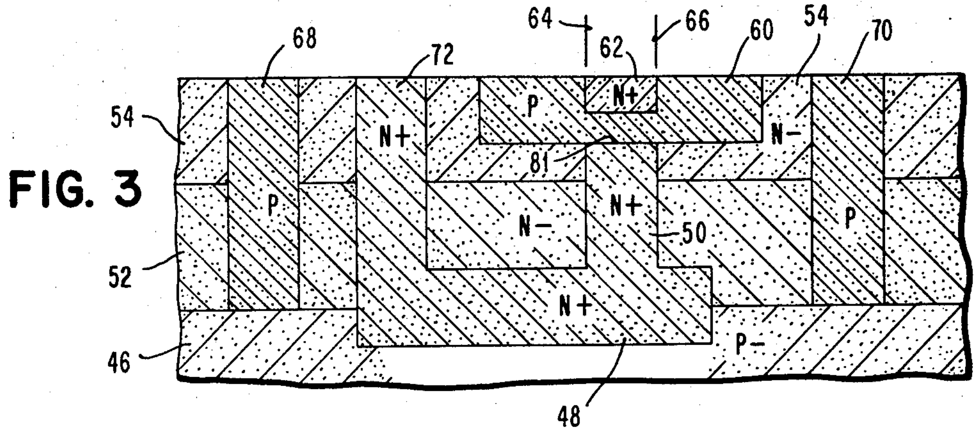
FIG. 3 illustrates a cross-sectional view of a monolithic integrated pedestal transistor fabricated according to the improved process of the present invention.
Figure 4:
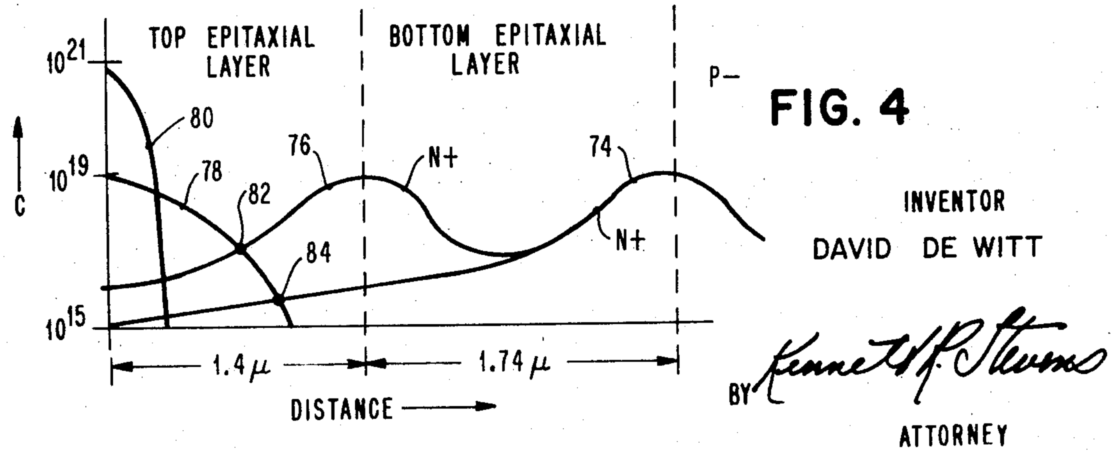
FIG. 4 is a graph illustrating the impurity profile for the structure fabricated according to the process of the present invention.

The pedestal planar transistor structure of FIG. 3 and its accompanying impurity profile of FIG. 4 illustrate the improved characteristics which are obtainable by applying the principles of the present invention.

The pedestal structure of the present invention is formed on a starting $P^-$ conductivity substrate 46 and includes a buried $N^+$ subcollector region 48, and an internal pedestal collector region 50 extending through a bottom epitaxial $N^-$ type conductivity layer 52 and into an upper epitaxial $N^-$ type conductivity layer 54. A P type conductivity base region 60 is formed in the upper epitaxial layer 54, and an $N^+$ type conductivity emitter region 62 is formed in the internal operational portion of the device. As similarly defined with respect to FIG. 1, the internal portion of the device is that region between lines 64 and 66, extended transversely through the device. Conventional P isolation regions 68 and 70 extend down to the $P^-$ substrate 46 and electrically isolate the device during operation. An $N^+$ reach-through region 72 provides a low resistivity path to the buried layer subcollector region 48. Although not shown, suitable metallic contacts are provided to the active regions of the pedestal transistor in known manner.

In FIG. 4, the impurity profile depicts the improvements over a prior art type device such as shown in FIG. 1. Outdiffusion of the subcollector region 48 and the pedestal region 50 and their respective impurity concentrations are illustrated by curves 74 and 76 and conventional base and emitter diffusion impurity profiles are represented by curves 78 and 80, respectively.

An internal base-collector junction 81 is defined by internal pedestal collector region 50 and the internal portion of the overall base region 60. The attendant impurity concentration is designated on the graph by point 82, which is the intersection of the base diffusion curve 78 and the outdiffused pedestal impurity profile curve 76. At this point, a high impurity concentration in the range of $10^{18}$ atoms/cc. is obtainable. The reduced impurity concentration level in the extrinsic collector portion is determined by the thickness and doping level of the top epitaxial layer 54. An extrinsic collector doping level of $10^{16}$ atoms/cc. is obtainable, illustrated at point 84, and results in a significant reduction in the overall collector-to-base capacitance. The overall collector-to-base capacitance includes the capacitance contributed by the internal horizontal base-to-collector junction 81 in the internal zone and the sidewall and horizontal wall base-to-collector junctions in the extrinsic portion of the device. It is realized that the collector-to-base capacitance per unit area is increased in the internal collector region because of the higher doped impurity level in the pedestal or internal pedestal collector region 50. Generally, and as applied to the present invention, the lower the net doping level on the lighter doped side of a junction, then as a result, lower capacitance value is obtained for that junction. However, the lightly doped $N^-$ impurity concentration regions in the extrinsic portion of the collector region significantly reduces its associated base-to-collector capacitance. Thus, the overall base-to-collector capacitance is reduced.

Furthermore, the existance of the highly doped pedestal region greatly aids in minimizing or eliminating the undesirable base-widening or "Kirk" effect phenomena. For the prior art structure of FIG. 1, as the injected current density from the emitter into the collector region becomes comparable to the collector bulk doping level, the collector junction is electrically pushed deeper into the collector region so as to effectively increase the base-width and cause a corresponding decrease in frequency performance, as measured, for example, by $F_T$. However, the increased doping level in the pedestal region 50 allows the transistor to withstand a much higher emitter-current density. Thus the geometries of the transistor devices in monolithic form may be decreased (increased current densities) without incurring the base widening phenomena or degradation in high frequency performance. Of course, it is realized that the ability to fabricate smaller devices in itself reduces capacitance problems.

Figure 5:
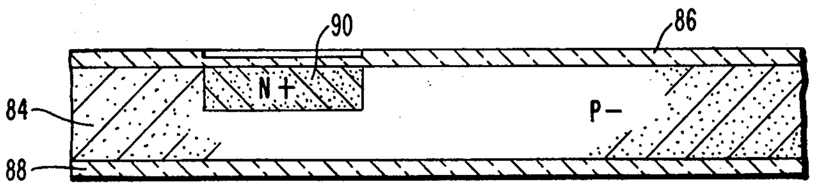
FIGS. 5 through 11 illustrate successive process steps employed in the fabrication of the pedestal transistor structure shown in FIG. 4.
Figure 6:
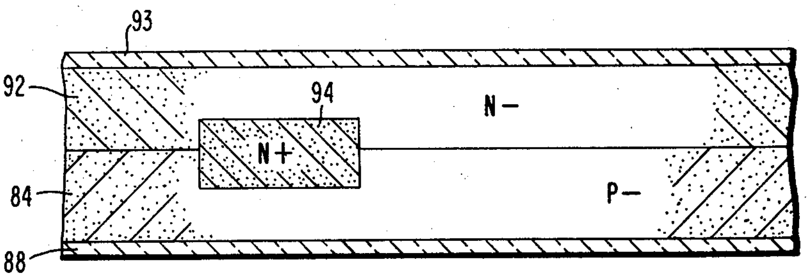
Figure 7:
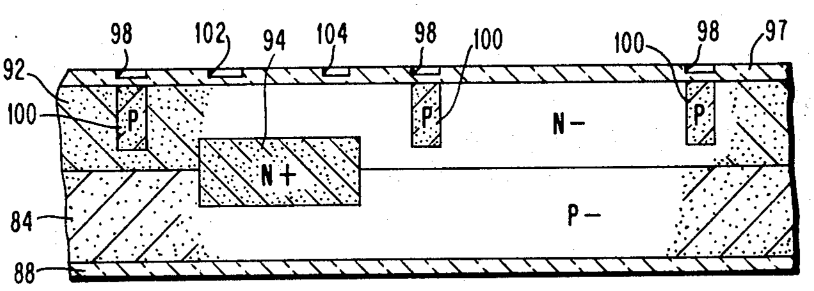

Now referring to FIGS. 5 through 7, a process for fabricating a pedestal type structure according to the present invention is illustrated. A starting $P^-$ substrate 84 is subjected to conventional thermal oxidation processes in order to form a pair of oxide masking layers 86 and 88. Using photoresist techniques, a subcollector window is opened on the top layer 86 and an $N^+$ subcollector region 90 is diffused therein by employing a suitable material such as arsenic having a $C_o$ (concentration) of $10^{21}$ atoms/cc.

Figure 8:
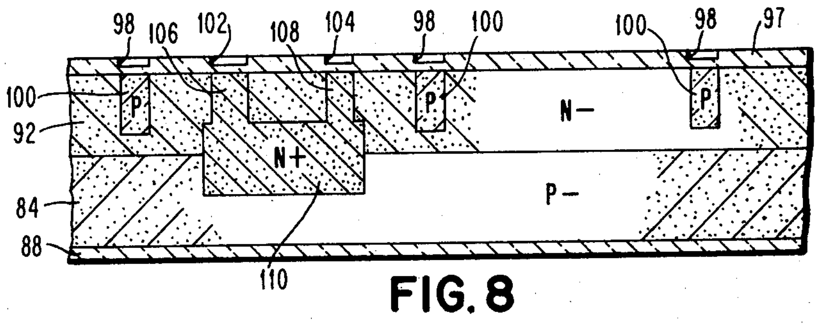
Figure 9:
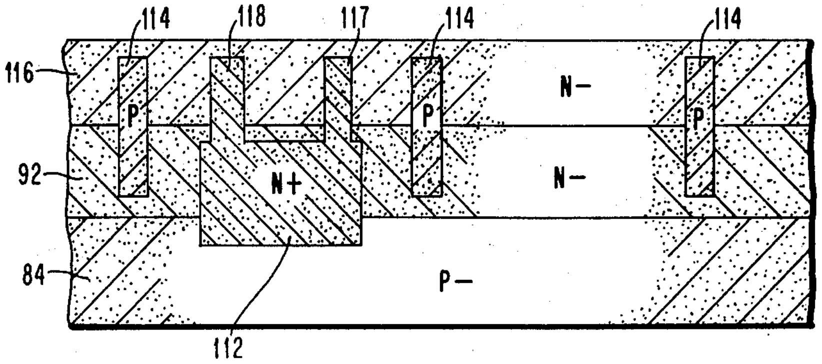

Then, as shown in FIG. 6, a bottom epitaxial layer 92 is grown over the starting $P^-$ substrate 84 after the oxide layer 86 is removed, and new layer 93 is grown. During the growth of the bottom epitaxial layer 92, the $N^+$ region 90 is further outdiffused to form a new subcollector region 94. The bottom epitaxial layer 92 is constituted by an $N^-$ type conductivity material having a thickness and resistivity in the range of 1.7 microns and 4 ohm-cm., respectively. This gives a concentration of approximately $2\times10^{15}$ atoms/cc. A new thermal oxide masking layer 97 is formed in preparation for pedestal and buried isolation steps, as depicted in FIGS. 7 and 8. Isolation windows 98 are opened in new oxide layer 97 prior to indiffusing a material such as boron into the epitaxial layer 92 in order to form a plurality of isolation regions 100. Additionally, a collector reach-through window 102 and a pedestal window 104 are similarly opened in the oxide layer 97 prior to their associates reach-through and pedestal diffusions. An impurity such as phosphorus is diffused through window 102 in order to form a reach-through region 106. Region 106 provides a low resistivity region for ultimately connecting the collector stripe (not shown) to the subcollector region. Next, a pedestal collector region 108 is formed by diffusing a material such as arsenic through window 104. The arsenic possesses similar properties, as previously mentioned. The region 108 extends down into the buried layer or subcollector region 110 so as to form a unitary collector structure. Regions 106 and 108 may be formed by a simultaneous diffusion step. Then, as shown in FIG. 9, additional top epitaxial layer 116 is grown on the lower or bottom epitaxial layer 92 subsequent to the removal of the oxide layer 97. During the growth of the top epitaxial layer 116, the subcollector region 110, the isolation regions 100, the pedestal subcollector region 108, and the reach-through diffusion region 106 further outdiffuse from the bottom epitaxial layer 92 and into the top epitaxial layer 116 to form new regions 112, 114, 117, and 118, respectively. In this example, an $N^-$ top epitaxial layer having a thickness of approximately 1.4 microns, a resistivity of 4 ohm-cm., and a concentration of $2\times10^{15}$ atoms/cc. is formed.

Often, a shallow capsule base diffusion will result in an extremely high sheet resistivity. Thus, in some instances, a separate extrinsic base-diffusion is often used to lower the effect of sheet resistivity. The extra base diffusion will lower the extrinsic base resistance and the side injection from the emitter side walls. It is realized some processes require only a single diffusion in order to form the entire base region; and the double base diffusion illustrated in FIGS. 10 and 11 is unnecessary.

Figure 10:
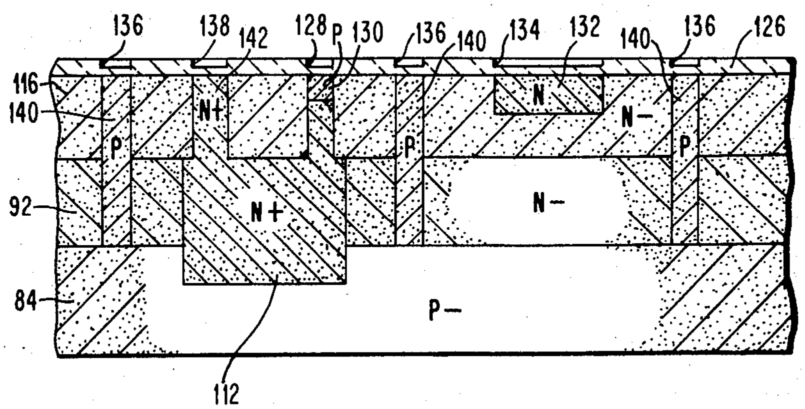
Figure 11:
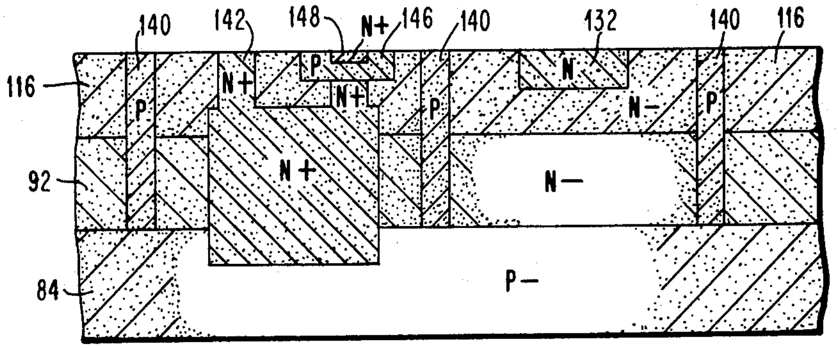

In FIG. 10, a window 128 is opened in oxide layer 126 in order to perform an internal base diffusion. A suitable P type material is employed and results in an internal base region 130. At this time, other necessary devices such as a diffused resistor 132 may be formed through opening 134. In order to insure the exact concentration levels at the surface of the top epitaxial layer 116 for the plurality of regions 114, and the reach-through region 118, appropriate reach-through diffusions are performed through the plurality of associated openings 136, and the opening 138. Further outdiffused regions are shown as isolation regions 140 and reach-through region 142 in FIG. 10. An extrinsic base diffusion produces an extrinsic base zone which in conjunction with the previous internal diffusion region 130 results in an overall base region 146, FIG. 11. Similarly, an emitter diffusion of a suitable $N^+$ type material results in emitter region 148 and completes the NPN transistor for the portion of the monolithic circuit illustrated in FIG. 11. Of course, in some processes a single diffusion step will suffice in order to form the entire base region 146 and separate internal and extrinsic base diffusions are unnecessary.

The following measured electrical characteristics were obtained in accordance with the present invention for a device having a phosphorus emitter and an arsenic collector region:

$BV_{cbo}=-9$ v.
$BV_{ebo}=4.5$ v.
$BV_{ceo}=3$–$5.5$ v.
$\beta=26$–$90$ at 10 milliamps
$C_c=.54$ pf. for a 1 mil x 1.5 mil emitter stripe device at $V_{CB}=0$ $C_c$=.26 pf. for a .1 mil by .5 mil emitter stripe device at $V_{CB}=0$ $F_T$=4.8–5.5 gHz (gigahertz) at 10 milliamperes for a .1 mil x 1.5 mil emitter stripe device, and at a $V_{CB}=+0.5$ v.

Figure 12:
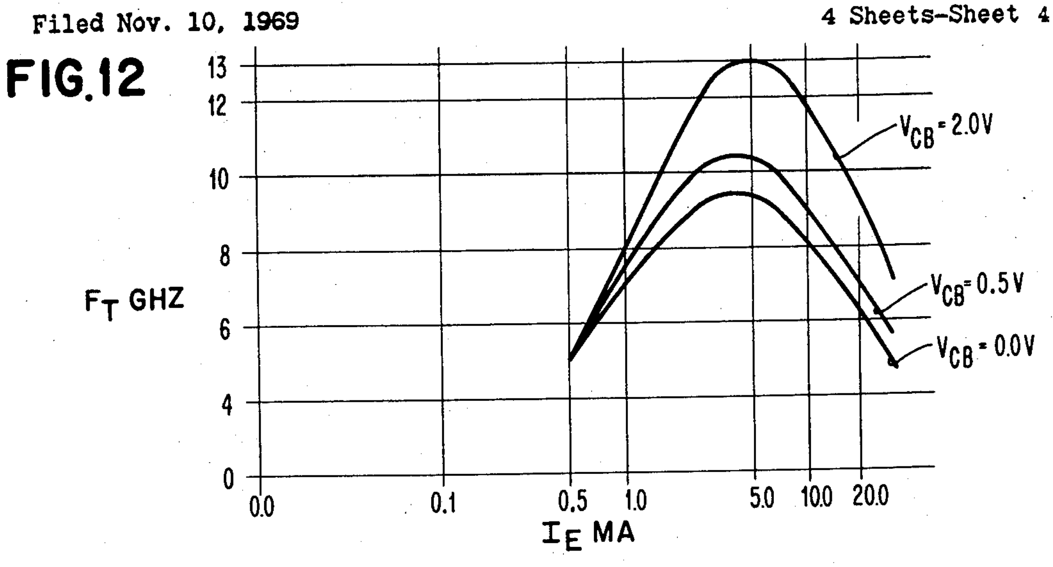
FIGS. 12 and 13 illustrate a plot of the gain bandwidth product, $F_T$, versus emitter current, $I_E$, for pedestal collector devices fabricated according to the present invention.
Figure 13:
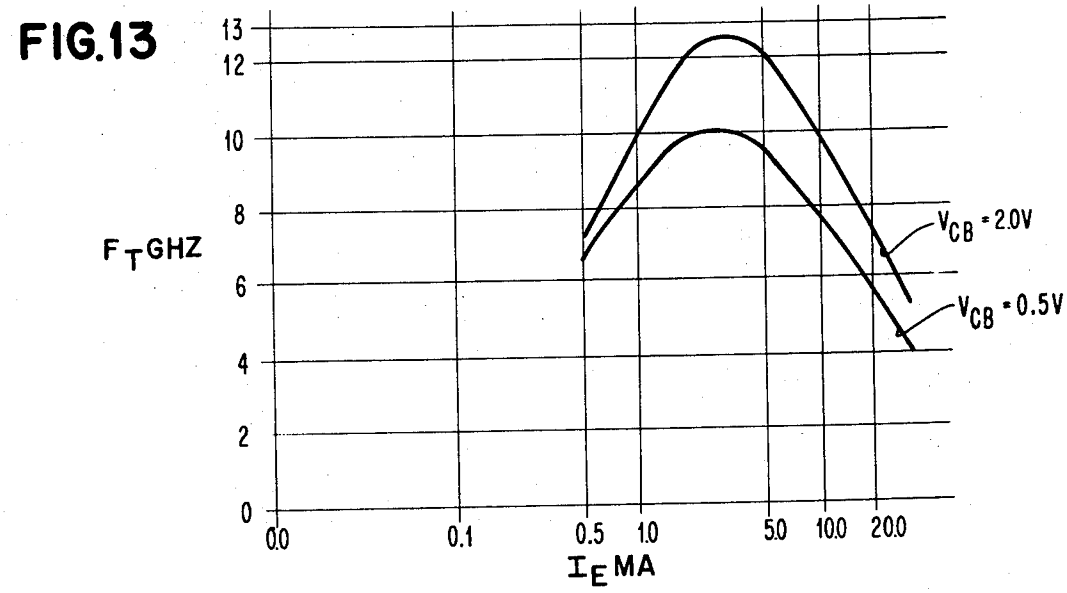
Figure 14:
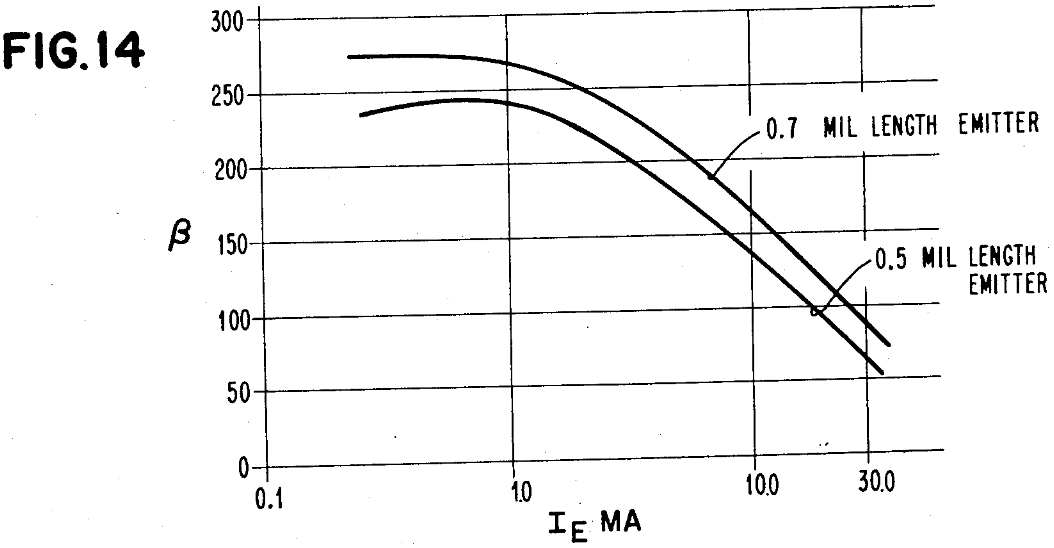
FIG. 14 illustrates a plot of current gain, $\beta$, versus emitter current, $I_E$, for transistors fabricated according to the present invention.

FIGS. 12 through 14 further illustrate the improved high frequency performance which is obtained in accordance with the present invention, but for devices having narrower horizontal geometries, arsenic emitters, and boron bases. In particular, the measured data shown for FIGS. 12 through 14 are for devices having a pair of base contact stripes and a spaced interposed emitter stripe in which the spacing between stripes and the stripe width is 75 microns. In FIG. 12, the improved high frequency performance is illustrated by a plot of gain bandwidth product, $F_T$, in gigahertz vs. emitter current, $I_E$, in milliamps. The measurements were taken on a device having a emitter stripe length of .7 mil for various values of base-to-collector voltages, $V_{CB}$. Similarly, FIG. 13 illustrates the improved high frequency performance for another device having an emitter stripe length of .5 mil for various collector-to-base voltage conditions, $V_{CB}$. In FIG. 14 the plot is for 0.7 and 0.5 emitter stripe length devices, but with beta, $\beta$, now plotted along the vertical axis instead of $F_T$. Finally, it is to be understood that $N^-$, N, and $N^+$ refer to starting impurity concentrations in the range of $10^{15}$, $10^{17}$, and $10^{20}$, respectively.

In actual tests, the devices having the characteristics illustrated in FIGS. 12–14 exhibited $F_T$ values in the range of 9.0 to 11.0 gigahertz and collector capacitance in the 0.08 to 0.11 picofarad range.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for fabricating a monolithic integrated circuit comprising at least one pedestal transistor device including the steps of:

(a) providing a substrate of a first conductivity type, (b) introducing an impurity dopant of second type into said substrate to form a subcollector region, the second conductivity type being of opposite type to said first conductivity type, (c) forming a bottom epitaxial layer of second conductivity type over the substrate and outdiffusing the subcollector region into the bottom epitaxial layer, the subcollector region being of lower resistivity than the bottom epitaxial layer, (d) introducing an impurity dopant of second conductivity type into the bottom epitaxial layer over a limited defined portion of the subcollector region for diffusing a pedestal collector region down into contact with the subcollector region, (e) forming a top epitaxial layer of second conductivity over the bottom epitaxial layer and outdiffusing the pedestal collector region into the top epitaxial layer for forming a continuous pedestal region extending from the substrate to the top epitaxial layer, (f) the top epitaxial layer contiguous with the continuous pedestal region defining an extrinsic collector region and having an impurity concentration doping level lower than that of the pedestal collector region, and (g) forming a base region in the top epitaxial layer, the base region forming an extrinsic base-collector junction with the extrinsic collector region and an internal base-collector junction with the continuous pedestal collector region.

2. A method for forming a monolithic integrated circuit comprising at least one pedestal transistor including the steps of claim 1 and further including:

(a) forming said continuous pedestal collector region with a higher doping level than the top epitaxial layer by a magnitude of approximately 100.

3. A method for forming a monolithic integrated circuit comprising at least one pedestal transistor including the steps of claim 2 and further including:

(a) forming said continuous pedestal collector and controlling its outdiffusion into the top epitaxial layer for providing a doping level of about $10^{17}$ atoms/cc. or greater at the internal base-collector junction.

4. A method for forming a monolithic integrated circuit comprising at least one pedestal transistor including the steps of claim 3 and further including the step of:

(a) controlling the impurity concentration and thickness of the top epitaxial layer for providing a doping level of approximately $10^{16}$ atoms/cc. at the extrinsic base collector junction.

5. A method for forming a monolithic integrated circuit having at least one pedestal transistor as in claim 4 further including the step of forming an emitter region by diffusing an impurity of second conductivity type into the base region.

References Cited

UNITED STATES PATENTS

| | | | |
|---|---|---|---|
| 3,244,950 | 4/1966 | Ferguson | 317—235 |
| 3,341,755 | 9/1967 | Husher et al. | 317—235 |
| 3,163,562 | 12/1964 | Ross | 148—33.4 |
| 3,220,896 | 11/1965 | Miller | 148—33.5 |
| 3,253,197 | 5/1966 | Haas | 148—1.5 X |
| 3,260,902 | 7/1966 | Porter | 317—235 |
| 3,312,881 | 4/1967 | Yu | 317—235 |
| 3,327,182 | 6/1967 | Kisinko | 317—235 |
| 3,387,193 | 6/1968 | Donald | 317—235 |
| 3,479,233 | 11/1969 | Lloyd | 148—188 X |
| 3,506,893 | 4/1970 | Dhaka | 148—175 X |
| 3,585,464 | 6/1971 | Castrucci et al. | 317—235 |

FOREIGN PATENTS

| | | | |
|---|---|---|---|
| 1,422,157 | 11/1965 | France | 148—175 |

HYLAND BIZOT, Primary Examiner

W. G. SABA, Assistant Examiner

U.S. Cl. X.R.

29—578; 117—201, 212; 148—187, 191; 317—235 R